United States Patent [19]

Capwell et al.

[11] Patent Number: 4,626,446
[45] Date of Patent: Dec. 2, 1986

[54] ELECTROLESS PLATING BATH MONITOR

[75] Inventors: Robert J. Capwell, Vestal; Robert G. Rickert, Endwell, both of N.Y.

[73] Assignee: International Business Machines Corporation, Armonk, N.Y.

[21] Appl. No.: 740,922

[22] Filed: Jun. 3, 1985

[51] Int. Cl.$^4$ ............................................. C23C 18/16
[52] U.S. Cl. ......................................... 427/8; 427/10; 427/443.1
[58] Field of Search .......................... 427/8, 10, 443.1; 118/712

[56] References Cited

U.S. PATENT DOCUMENTS

| | | | |
|---|---|---|---|
| 3,375,178 | 3/1968 | Locke | 204/1 |
| 3,775,277 | 11/1973 | Pompei et al. | 204/192 |
| 4,006,063 | 2/1977 | Ensanian | 204/1 T |
| 4,125,642 | 11/1978 | Petit et al. | 427/8 |
| 4,182,638 | 1/1980 | Cooke et al. | 148/6.15 R |
| 4,331,699 | 5/1982 | Suzuki et al. | 427/8 |
| 4,477,484 | 10/1984 | Paoletti et al. | 427/10 |

OTHER PUBLICATIONS

Greene, "Evaluating the Condition of Electroless Plating Baths", IBM TDB, vol. 7, No. 3, Aug. 1964.
Tucker, "Instrumentation and Control of Electroless Copper Plating Solutions", Design and Finishing of Printed Wiring and Hybrid Circuits Symposium, Ft. Worth, Texas, Jan. 21-22, 1976.
"Continuous Monitoring of Plating Bath Plating Rate", M. J. Canestaro, IBM Technical Disclosure Bulletin, vol. 17, No. 6, Nov. 1974, p. 1581.

*Primary Examiner*—John D. Smith
*Attorney, Agent, or Firm*—Norman R. Bardales

[57] ABSTRACT

Method and apparatus for determining the deposition capability of an electroless metal plating bath by monitoring the difference in instantaneous electrical potential between a pair of test coupons immersed in the bath in which one coupon is seeded to initiate plating thereon of the bath metal and the other coupon has a surface of the bath metal. The magnitude of the difference in potential and its change with respect to time during concurrent immersion of both coupons indicate the probable rate and quality of the bath deposition onto work pieces.

6 Claims, 3 Drawing Figures

ELECTROLESS PLATING BATH MONITOR

FIELD OF THE INVENTION

This invention relates generally to electroless metal plating baths and, more particularly, to a method and apparatus for quickly determining the probable plating rate and quality of such baths.

BACKGROUND OF THE INVENTION

Electroless plating baths are used to coat non-metallic parts or parts having small intricate shapes. Once plating is initiated, the process is thermodynamically and kinetically driven and deposits a layer of metal uniformly over the immersed parts. Electroless plating is frequently employed to fabricate copper printed circuits.

Plating with an electroless bath, such as in the formation of printed circuits, requires careful sensitization of the substrates and vigilant maintenance of the bath constituents within narrow ranges as to proportionalities and temperature. Sensitization of the areas to be plated includes treatment with a solution of a colloidal metal and then an acceleration step to remove inactive components of the colloid from the sensitized substrate. After suitable rinsing, the sensitized substrate is immersed in the electroless bath where plating is initiated autocatalytically and builds to the desired thickness. Thereupon the substrate is removed and rinsed.

An effective and efficient plating process requires frequent monitoring to insure that the proportions of the constituents are maintained within a narrow tolerance. Although there are instruments and techniques to determine the approximate status of the baths, there occur undetected imbalances or variations in both the sensitization process or electroless bath composition that prevent the deposition of a uniform layer of metal over the entire seeded areas. Voids are typically the result.

One difficulty has been to accurately determine whether the electroless bath is in "take," that is, whether the bath will initiate and continue metal deposition on the seeded surface in a desired and normal manner. This has been done typically by removing and inspecting the immersed parts for coating quality but with the disadvantages that much time has been lost and, if the plating is defective or unsatisfactory, the work pieces must be scraped. Another method has been to measure resistance of the plating by determining the decrease in resistance of a plurality of seeded hole walls arranged in a series circuit, as in U.S. Pat. No. 4,477,484. This method shortens the determination time but still requires prolonged immersion to effect a relatively thick, low resistance coating. Some other monitoring schemes for autocatalytic plating baths are described in U.S. Pat. No. 3,375,178 where plating is noted to occur as long as bath pH is maintained and the difference in potential between a metal part to be plated and an inert reference electrode remains above a predetermined threshold; U.S. Pat. No. 4,331,699 where charge dissipation is observed with respect to time and reaction resistance is calculated a plurality of times to project a rate of plating; U.S. Pat. No. 4,182,638 where a metal substrate reacts with a constituent of a coating solution and the magnitude of current flow is used to maintain constituent concentrations; and U.S. Pat. No. 4,125,642 where potential difference between a conductive tank and non-catalytic probe is measured as an indication of accumulated decomposition products, but not plating activity. Such schemes, however, fail to suggest a manner in which to quickly determine the efficacy of an electroless plating bath with respect to seeded non-metallic substrates.

OBJECTS AND SUMMARY OF THE INVENTION

It is accordingly a primary object of this invention to provide an improved method of rapidly determining the "take" or effectiveness of an electroless or autocatalytic chemical plating bath to deposit metal on a seeded work piece.

Another object of this invention is to provide a method of indicating "take" or effectiveness of an electroless or autocatalytic chemical plating bath by measuring the difference in electrical potential between a substrate surface seeded to induce deposition of a metal and an electrode of the metal to be plated by the bath while both substrate and electrode are immersed in the bath.

Another object of this invention is to provide a method and apparatus for rapidly indicating the probable plating ability of a copper electroless plating bath by observing the change with respect to time in electrical potential difference between a substrate surface seeded to induce copper deposition thereon and a copper electrode while the substrate and electrode are immersed in the bath.

Yet another object of this invention is to provide apparatus for determining the "take" of an electroless plating bath by measuring the difference in potential between an immersed first coupon having a non-metallic seeded surface and an immersed second coupon of the same metal as deposited by the bath.

The foregoing objects are attained in accordance with this invention by attaching means to indicate electrical potential between a pair of coupons immersed in an electroless chemical plating bath with one coupon being a non-metallic substrate having a surface treated, as by seeding, to promote metal deposition thereon of metal from the bath and the second coupon composed of metal the same as that deposited by the bath. Upon initial immersion of the coupons, the non-metallic coupon is at a different potential with respect to the metal coupon. If the bath is in "take," that is, capable of and is depositing metal ions onto the seeded surface at the usual efficiency, the difference in potential will quickly be decreased within a few minutes after immersion to indicate a reversed polarity of small, but nearly negligible, difference while plating continues. The decrease in difference in potential appears to occur at the completion of a molecular monolayer on the treated surface. Time values until the change in polarity can be compared with those of former satisfactory and unsatisfactory depositions to determine the potential plating quality of the bath.

This invention has the advantage of requiring merely a few minutes to indicate the capability and probable quality of an electroless plating bath and its product. Fewer work pieces will be scraped because of plating voids and defects, and plating baths can be maintained at a higher efficiency. Voltage differences are an easily discernible property that does not require calculation, extensive training, or raise a question of subjective interpretation. Optionally, the sensed difference in potential can be used to actuate an automated indicator.

The foregoing and other objects, features and advantages of the invention will be apparent from the following more particular description of a preferred embodiment of the invention as illustrated in the accompanying drawing.

DESCRIPTION OF THE PREFERRED EMBODIMENT

Figure 1:
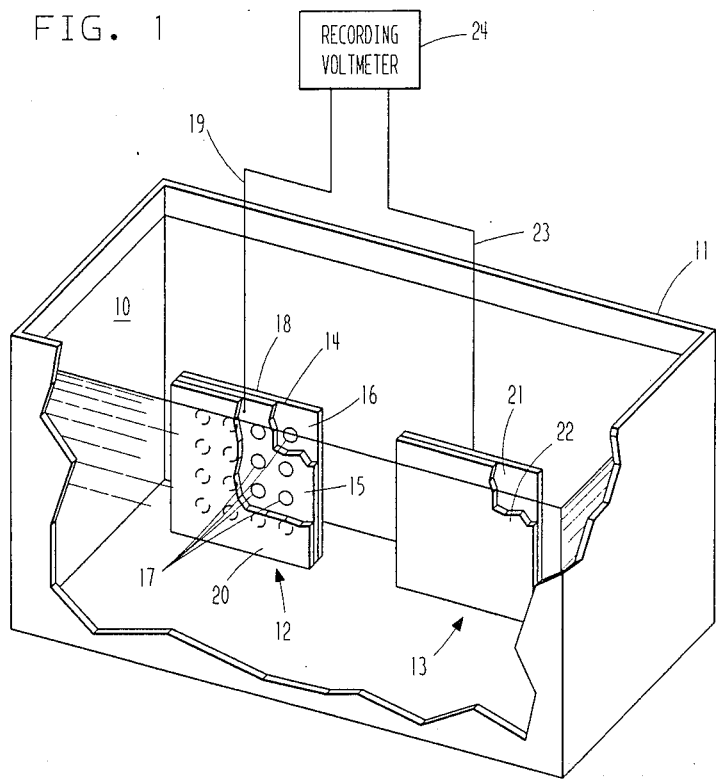
FIG. 1 is a schematic diagram of test coupons, partly broken away to illustrate construction, immersed in a plating bath in accordance with the principles of the invention.

Referring to FIG. 1, there is shown apparatus for determining the effectiveness or "take" of an electroless or chemical plating bath 10 contained in an inert tank 11 and in which is suspended a pair of test coupons, indicated generally as 12 and 13. In the illustrated embodiment copper is to be plated and bath 10 typically contains constituents such as copper sulfate, sodium hydroxide, sodium cyanide, formaldehyde, a wetting agent and ethylenediamine tetra acetic acid, all held in a temperature range of 60° to 80° C. Copper molecules will deposit onto previously prepared surfaces of work pieces immersed therein, such as circuit panels. Because the proportions of constituents change with use, even with replenishment, or the work piece preparation process is improper, the rate and quality of deposition is not constant nor certain for each new batch of work pieces to be plated. To avoid lost time and a costly scrape rate, the "take" or ability of the bath to deposit metal should be determined before plating is attempted. This is done by the temporary immersion of test coupons 12 and 13.

Coupon 12 simulates a small circuit panel or card by being an insulative substrate 14, such as cured epoxy with imbedded glass fibers or cloth, a layer 15 of copper laminated to one surface 16, and a plurality of plated through holes 17 connecting with the copper layer and extending through the substrate so as to be flush with the opposite substrate surface 18. A conductor 19 having an insulating coating is conductively secured, as by soldering, to copper layer 15. The coupon is sensitized by immersion in stannous and palladium chloride solutions to produce a "seeded" surface that has sites at which copper plating will start. The sensitizing process is preferably the same as that used for the work pieces or panels to be plated. An inert insulative coating 20, such as phenoxy, is applied over the conductor-copper surface joint and copper layer 15 to prevent contact with the bath. Coating 20 is also forced in the plated holes to a point flush with surface 18. This coating allows only sensitized surface 18 to be exposed to the electroless plating bath.

Coupon 13 is merely a copper foil or plate 21 that may be optionally laminated to a supporting substrate 22. The foil is secured to a conductor 23 having an insulative covering. Unattached ends of conductors 19 and 23 are connected to a respective terminal of a recording millivolt meter 24. A strip chart recorder is also a convenient instrument for providing a record. Taking care to avoid mutual contact or grounding, the coupons are immersed in the bath in tank 11. Continual bath agitation is desirable during both the determination of the plating characteristics and subsequent plating of work pieces to achieve a faster, more uniform deposition.

Figure 2A:
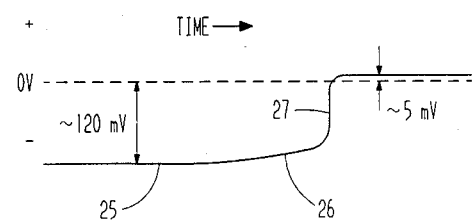
FIGS. 2a and 2b are wave forms of the types of change in electrical potential between the coupons of FIG. 1 that can occur with respect to time during metal deposition.

When the coupons are placed in the bath, the voltage of the seeded coupon will indicate a potential of approximately 100-150 millivolts that is negative relative to the potential of copper coupon 13 as seen at 25 on the voltage wave form in FIG. 2a. That relationship holds for approximately 3 to 7 minutes with a slight decrease in the voltage difference, as at 26. During this time, copper ions are attaching to the seed sites on surface 18. At the conclusion of this time, a monolayer of copper molecules apparently covers nearly the entire surface 18 and the potential difference decreases at a relatively fast rate, as seen at 27 on the voltage wave form. When the monolayer completes its growth, the potential difference passes beyond the zero level to an opposite polarity of approximately five millivolts. Such a phenomenon appears to be caused by a potential drop across the thin seed layer on surface 18.

Figure 2B:
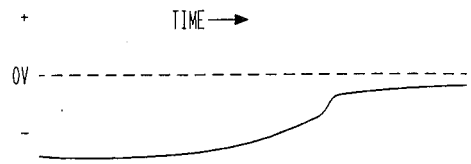

Failure of a bath to "take" will be indicated by a wave form, such as shown in FIG. 2b, which indicates delayed formation of a monolayer. An absence of a definite voltage transition or abrupt decrease is noted and the change in potential is more gradual. This may be due either to the bath or seeding process. By comparing the results obtained with a history of prior wave forms and corresponding plating quality, accurate conclusions can readily be drawn in approximately five to ten minutes. The time from initial immersion of the coupons until the change in polarity can be easily indicated by also connecting the coupon leads to a voltage comparator circuit whose changing output is used to turn on and off a timer to indicate the elapsed time. When initially immersed, the potential difference is used as a start signal and, when relative polarity changes, the signal serves to stop the timer and actuate an alarm. With this arrangement, automatic timing is obtained and continual operator observance is not required.

Seeded coupons 12 can be made by various processes. They may be made by cutting large panels into several small pieces. Copper layer 15 can be plated up or laminated as a foil, but it is desirable that a plurality of plated through-holes be conductively connected with layer 15 to provide a corresponding plurality of paths to seeded surface 18. Surface 18 is also preferably the only exposed portion of coupon 12 that will initiate plating. Coupon seeding should be done in the same manner as the work product to assure test validity.

The disclosed technique readily accommodates variations in bath activity due to rejuvenation or use because the elapsed time from initial immersion of the coupons until the rapid shift in potential is not critical within a range of several minutes. Probable bath performance is indicated principally by the occurrence of the rapid potential shift. The time within which the shift should occur will be determined by a history of wave forms and their corresponding plating qualities. Test coupons as disclosed may be placed in the electroless bath at the same time work pieces are immersed, if desired.

While the invention has been particularly shown and described with reference to a preferred embodiment thereof, it will be understood by those skilled in the art that changes in form and details may be made therein without departing from the spirit and scope of the invention.

What is claimed is:

1. A method of determining plating characteristics of an electroless metal plating bath comprising the steps of:

placing in said bath a first body having a surface of metal the same as the metal to be plated by said bath;

placing in said bath with said first body a second body having a surface seeded to initiate autocatalytic deposition of metal from said bath thereon; and measuring the difference in electrical potential between said surface of metal of said first body and said seeded surface of said second body as a function of immersion time during plating of said bath.

2. The method of claim 1 wherein said bath is an electroless copper plating bath and said surface of said first body is copper.

3. The method of claim 2 wherein said surface of said second body has been seeded in a bath of stannous and palladium chlorides.

4. The method of claim 2 wherein the surface of said second body has been seeded in a process to initiate deposition of copper when placed in an electroless copper plating bath.

5. The method of claim 1 further including the step of terminating said measurement step when the polarity of said potential difference changes from the initially indicated polarity.

6. The method of claim 4 further including the step of comparing said potential difference values versus time with known values.

* * * * *